US009620432B2

United States Patent
Cao et al.

(10) Patent No.: US 9,620,432 B2
(45) Date of Patent: Apr. 11, 2017

(54) DIELECTRIC THERMAL CONDUCTOR FOR PASSIVATING EFUSE AND METAL RESISTOR

(71) Applicant: INTERNATIONAL BUSINESS MACHINES CORPORATION, Armonk, NY (US)

(72) Inventors: Qing Cao, Yorktown Heights, NY (US); Kangguo Cheng, Schenectady, NY (US); Zhengwen Li, Scarsdale, NY (US); Fei Liu, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/843,786

(22) Filed: Sep. 2, 2015

(65) Prior Publication Data

US 2017/0062302 A1  Mar. 2, 2017

(51) Int. Cl.
| | | |
|---|---|---|
| *H01L 29/00* | (2006.01) | |
| *H01L 23/367* | (2006.01) | |
| *H01L 23/525* | (2006.01) | |
| *H01L 23/373* | (2006.01) | |
| *H01L 29/06* | (2006.01) | |

(52) U.S. Cl.
CPC ........ *H01L 23/367* (2013.01); *H01L 23/3732* (2013.01); *H01L 23/5256* (2013.01); *H01L 29/0649* (2013.01)

(58) Field of Classification Search
CPC .............. H01L 23/5256; H01L 25/0657
USPC ........................................ 257/529
See application file for complete search history.

(56) References Cited

U.S. PATENT DOCUMENTS

| | | | |
|---|---|---|---|
| 4,972,250 A | 11/1990 | Omori et al. | |
| 5,087,959 A | 2/1992 | Omori et al. | |
| 6,033,939 A * | 3/2000 | Agarwala | H01L 23/5258 257/E23.15 |
| 6,323,067 B1 | 11/2001 | Ning | |
| 6,828,652 B2 * | 12/2004 | Kothandaraman | H01L 23/5256 257/50 |
| 7,485,944 B2 | 2/2009 | Kothandaraman et al. | |
| 7,485,994 B2 | 2/2009 | Garvey | |
| 7,491,577 B2 * | 2/2009 | Sturcken | H01L 21/4871 257/706 |
| 7,982,285 B2 * | 7/2011 | Park | H01L 23/5252 257/209 |

(Continued)

OTHER PUBLICATIONS

Lasance, C.J.M. et al., "The Thermal Conductivity of Silicon Dioxide," Electronics Cooling Magazine, Aug. 2004. (pp. 1-2).

(Continued)

*Primary Examiner* — Theresa T Doan
(74) *Attorney, Agent, or Firm* — Tutunjian & Bitetto, P.C.; Vazken Alexanian (57) ABSTRACT

A semiconductor device includes a first dielectric layer formed on a second dielectric layer and planar contacts formed in the second dielectric layer. The planar contacts are spaced apart to form a gap therebetween. The first dielectric layer includes a thermally conductive dielectric layer and is formed on lateral sides of the planar contacts and in the gap. A resistive element is formed between the planar contacts over the gap and in contact with at least the thermally conductive dielectric layer in the gap.

16 Claims, 5 Drawing Sheets

(56) References Cited

U.S. PATENT DOCUMENTS

| | | |
|---|---|---|
| 8,125,036 B2 | 2/2012 | Schmidt |
| 8,841,768 B2 | 9/2014 | Von Koblinski et al. |
| 2013/0215663 A1 | 8/2013 | Chung |
| 2014/0200158 A1 | 7/2014 | Bowen et al. |
| 2014/0256096 A1 | 9/2014 | Koezuka et al. |

OTHER PUBLICATIONS

Shamsa, M. et al., "Thermal Conductivity of Diamond-Like Carbon Films," Applied Physics Letters, No. 89, Oct. 2006. (pp. 1-3).

\* cited by examiner

DIELECTRIC THERMAL CONDUCTOR FOR PASSIVATING EFUSE AND METAL RESISTOR

BACKGROUND

Technical Field

The present invention relates to resistive elements, and more particularly to structures and methods for passivating resistive elements using a thermally conductive dielectric material.

Description of the Related Art

With current semiconductor device designs, $WSi_x$ is employed for metal precision resistors and electric-Fuse (eFuse) materials. These devices employ typical dielectric materials, such as silicon oxide, to support and surround the metal materials of the metal resistors and eFuses. For example, $SiO_x$ is employed to insulate $WSi_x$. During the programming of eFuses, a large amount of heat can be generated (e.g., >800 degrees C.). However, the thermal conductivity of $SiO_x$ is low, and heat cannot be dissipated quickly enough. The build-up of heat during eFuse programming leads to thermal rupture and electromigration. Thermal rupture is undesirable for eFuse programming control, and temperature fluctuation is undesirable for metal resistor control.

SUMMARY

A semiconductor device includes a first dielectric layer formed on a second dielectric layer and planar contacts formed in the second dielectric layer. The planar contacts are spaced apart to form a gap therebetween. The first dielectric layer includes a thermally conductive dielectric layer and is formed on lateral sides of the planar contacts and in the gap. A resistive element is formed between the planar contacts over the gap and in contact with at least the thermally conductive dielectric layer in the gap.

Another semiconductor device includes a substrate including a shallow trench isolation region formed thereon. A first dielectric layer is formed on the shallow trench isolation region. A thermally conductive dielectric layer is formed on the first dielectric layer. The thermally conductive dielectric layer includes diamond-like carbon. Planar contacts are formed in the thermally conductive dielectric layer. The planar contacts are spaced apart to form a gap therebetween having the thermally conductive dielectric layer therein. A resistive element is formed between the planar contacts and over the gap and in contact with the thermally conductive dielectric layer in the gap. Heat sinks are formed in the first dielectric layer and in contact with the planar contacts on opposite sides of the resistive element outside a footprint of the resistive element.

A method for forming a semiconductor device includes forming at least one heat sink in a first dielectric layer; forming a thermally conductive dielectric layer on the first dielectric layer; patterning the thermally conductive dielectric layer to form planar contacts within the thermally conductive dielectric layer, the planar contacts being spaced apart from each other to form a gap therebetween, the planar contacts being contact or near contact the at least one heat sink; and forming a resistive element between the planar contacts over the gap and in contact with at least the thermally conductive dielectric layer in the gap.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, structures, devices and methods are provided for controlling conditions of an electrical fuse (eFuse) for programming or other applications. In one useful embodiment, insulating materials are employed in and around the fuses to dissipate heat. The insulating material preferably includes a thermal conductivity that exceeds standard dielectric materials such as, e.g., SiN, or $SiO_x$. The standard dielectric materials around the fuse are replaced with electrically insulating, but highly thermally conductive materials for heat dissipation. Such materials may include diamond-like carbon (DLC) or other similar materials. In eFuse or rupture mode (RM) applications, the diamond-like carbon will mitigate the heat dissipation problem. Diamond-like carbon has thermal conductivity about 10× greater than that of $SiO_x$. Additional areas surrounding the eFuse may also include diamond-like carbon to act as an additional heat sink so that the eFuse programming conditions can be better controlled.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
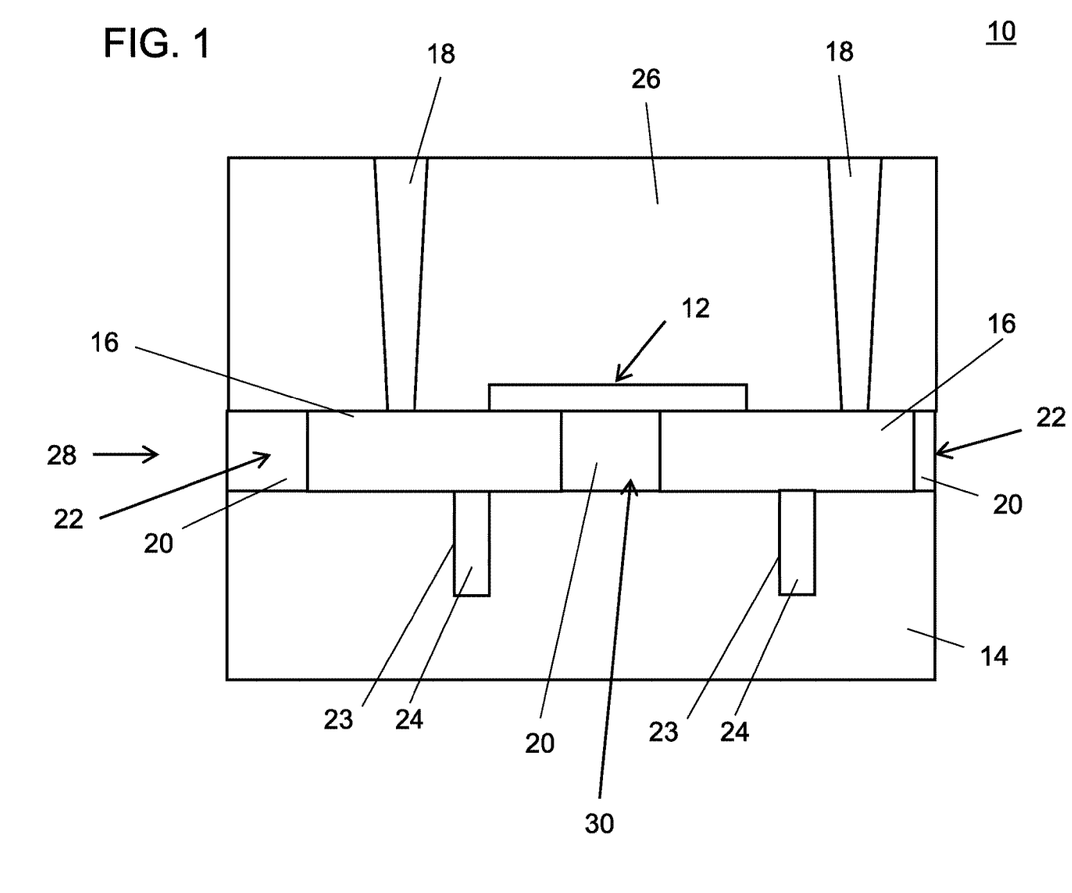
FIG. 1 is a cross-sectional view of a semiconductor device having a resistive element (e.g., eFuse) in accordance with the present principles.

Referring now to the drawings in which like numerals represent the same or similar elements and initially to FIG. 1, a cross-sectional view is shown for a semiconductor device 10 having a resistive element 12 with heat dissipation in accordance with the present principles. The resistive element 12 is formed on a dielectric layer or substrate 14. The substrate 14 may include a plurality of layers, including semiconductors, metallizations, dielectrics, etc. The dielectric layer 14 may include an oxide or a nitride material. The dielectric layer 14 may be patterned to form trenches 23 therein, which are filled with conductive materials to form heat sinks 24. In one embodiment, the heat sinks 24 include a same material as planar contacts 16. In other embodiments, the heat sinks 24 include a different material than the contacts 16. The heat sinks 24 preferably include a highly conductive material, such as Cu, W, Al, etc. to draw energy away from the resistive element 12. The heat sinks 24 are positioned to be outside the area of the resistive element 12 to ensure that an adequate amount of energy is available to blow the fuse in the case where the resistive element 12 is a fuse.

The contacts 16 are separated and the resistive element 12 bridges a separation gap 30 between the contacts 16. Within a layer 28 of the contacts 16, a thermally conductive dielectric material 20 is formed. In a particularly useful embodiment, the material 20 includes diamond-like carbon (DLC), although other materials may be employed. The material 20 is formed and then patterned to provide material in gap 30 and areas 22 surrounding the contacts 16. An interlevel dielectric (ILD) 26 is formed on the contacts 16 and the resistive element 12. The ILD 26 may include an oxide, (e.g., $SiO_x$). Vertical contacts 18 are formed through the ILD 26.

In one embodiment, the resistive element 12 includes a fuse. The may include a silicide material, such as WSi, although other materials may be employed. During a programming operation of the fuse, a current is increased through the fuse to cause the fuse to melt rather than thermally rupture as the rupture causes collateral damage. The heat sinks 24 and the material 20 assist in dissipating energy to prevent fuse rupture. In other embodiments, the resistive element 12 may include a resistor, and heat can be dissipated for the resistor using the heat sinks 24 and the material 20.

Figure 2:
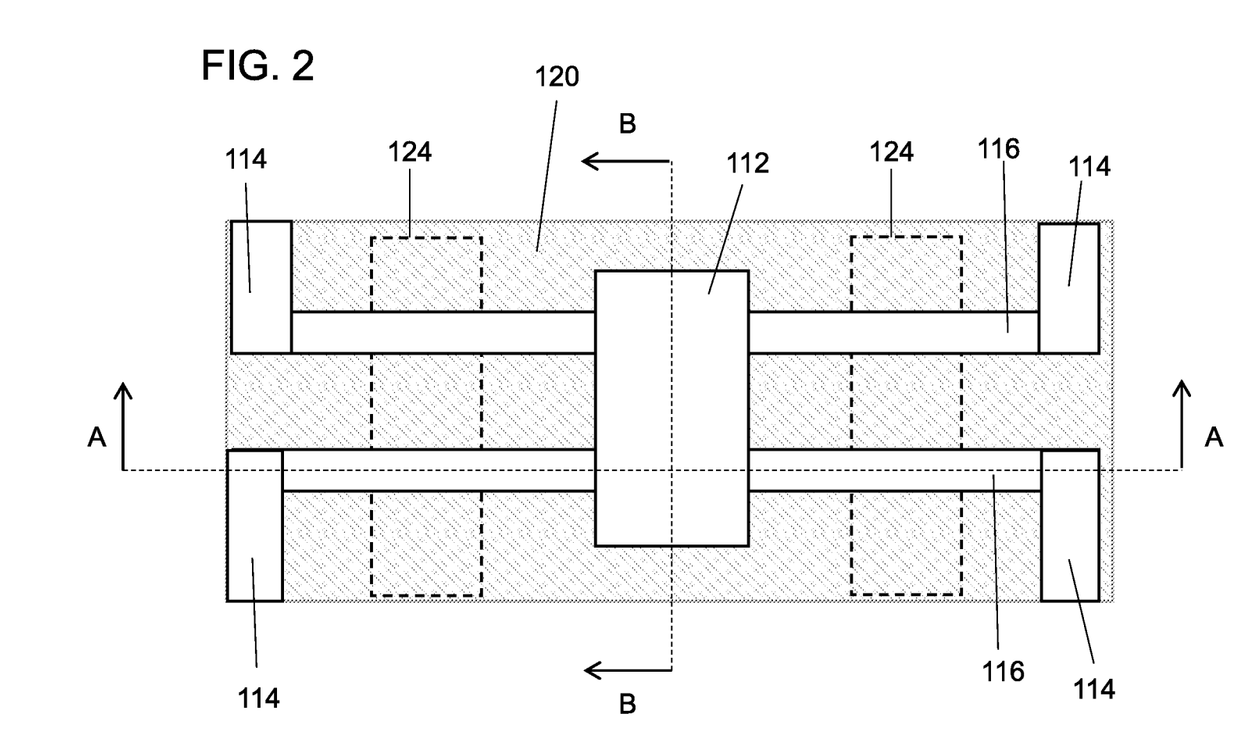
FIG. 2 is a top view of another semiconductor device having an eFuse in accordance with the present principles.

Referring to FIG. 2, a top view is shown for another embodiment of a device 100 having an electrically programmable fuse 112 (or resistor) in accordance with the present principles. The fuse 112 is connected across planar contacts 116, which are in turn connected to other conductive structures 114. A thermally conductive dielectric material 120 (e.g., DLC or the like) surrounds the planar contacts 116. A portion of the fuse 112 sits on the material 120. Heat sinks 124 are formed below and in contact with the contacts 116. The top view of FIG. 2 has a top dielectric layer removed for ease of visualization.

Figure 3:
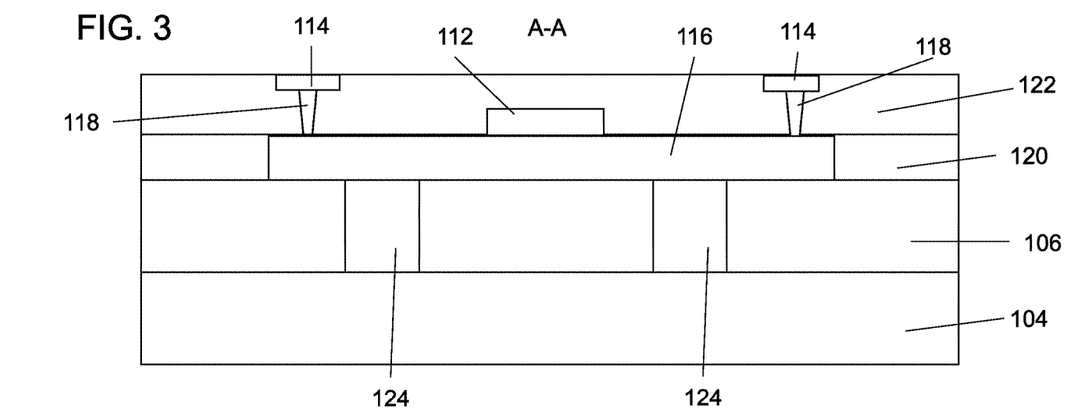
FIG. 3 is a cross-sectional view taken at section line A-A of FIG. 2 showing the semiconductor device in accordance with the present principles.

Referring to FIG. 3, a cross-sectional view taken at section line A-A in FIG. 2 shows heat sinks 124 formed below the contacts 116. The heat sinks 124 may be formed as dummy gate structures formed in a dielectric layer 106.

Dielectric layer 106 may include a material employed for isolating gates or middle of the line contact metal. In one embodiment, the dielectric layer 106 includes a high density plasma oxide. The dielectric layer 106 may be formed on a shallow trench isolation (STI) region 104, although other structures may be included instead of STI 104. STI 104 may include an oxide material.

An ILD layer 122 may be formed over the fuse 112 and contacts 116. The ILD layer may include an oxide, and more particularly may include a low-k SiCHO material. Vias 118 and metal connections 114 are formed to make electrical connections with the contacts 116. Vias 118 may be included in a V0 level while the metal connections may be at the M1 level. Other metallization levels may also be occupied.

Figure 4:
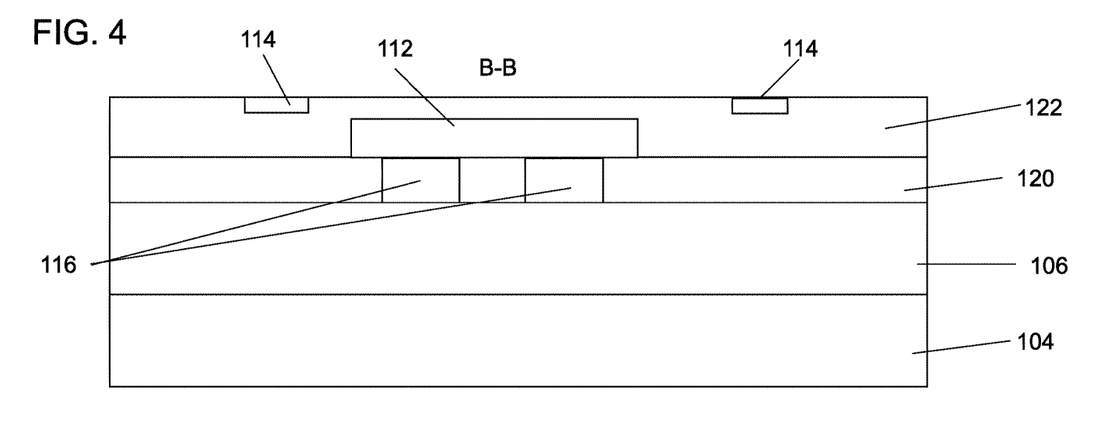
FIG. 4 is a cross-sectional view taken at section line B-B of FIG. 2 showing the semiconductor device in accordance with the present principles.

Referring to FIG. 4, a cross-sectional view taken at section line B-B in FIG. 2 is shown. Fuse 112 forms a bridge across the contacts 116. Metal connections 114 are illustratively shown at the M1 level. Other metallization levels may also be occupied. Here, the fuse 112 may extend further passed the contacts 116 and make additional contact with the material 120 at its edge portions.

Referring to FIGS. 5-8, method steps for constructing a resistive element for improved heat dissipation is illustratively shown in accordance with the present principles. The resistive element may be formed as part of the semiconductor device 100, which may include fin field effect transistors. Prior to the structure depicted in FIG. 5, fin module formation is performed including fins for forming transistors.

Figure 5:
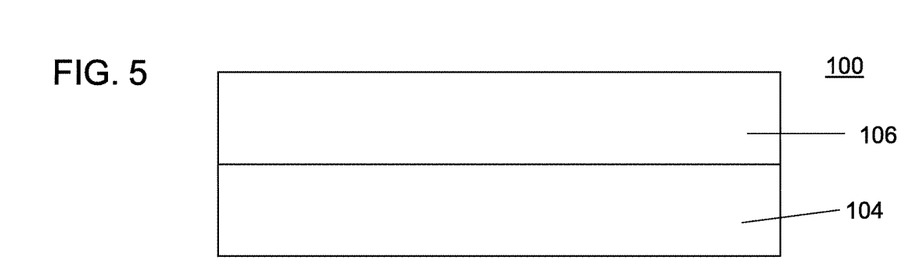
FIG. 5 is a cross-sectional view showing a partially fabricated semiconductor device with a shallow trench isolation (STI) region and a dielectric layer formed on the STI region in accordance with the present principles.

Referring to FIG. 5, a dielectric layer 104 is formed on an STI region 106. The dielectric layer 104 may be formed using a high density plasma oxide deposition process. The STI 106 may be formed using chemical vapor deposition (CVD) or other suitable deposition processes.

Figure 6:
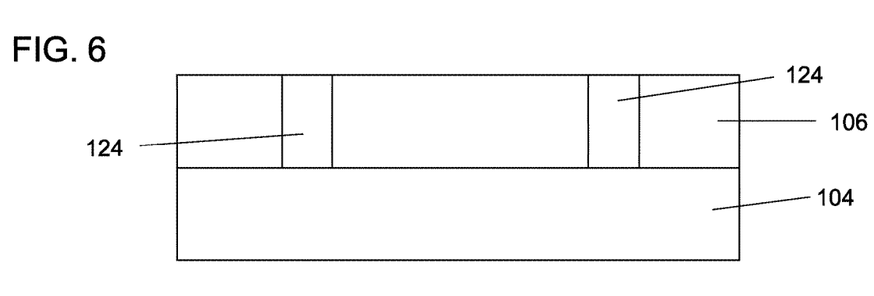
FIG. 6 is a cross-sectional view showing the semiconductor device of FIG. 5 with heat sinks formed in the dielectric layer in accordance with the present principles.

Referring to FIG. 6, gate structures (PC) are formed on the device 100. The gate structures may include dummy gate that is replaced later in the process with a gate conductor. The dielectric layer 106 is patterned using a same mask as the gate structures in other parts of the device (no additional mask is needed). The gate conductors are employed to form heat sinks 124 from gate metal materials, such as Cu, W, Al, or any other suitable conductor. In one embodiment, the heat sinks 124 may also include a gate dielectric layer and spacers in addition to a replacement material deposition since the heat sinks 124 are being formed with the gate structures in other parts of the device. Source and drain regions (not shown) are also formed in an active area of the device 100.

Figure 7:
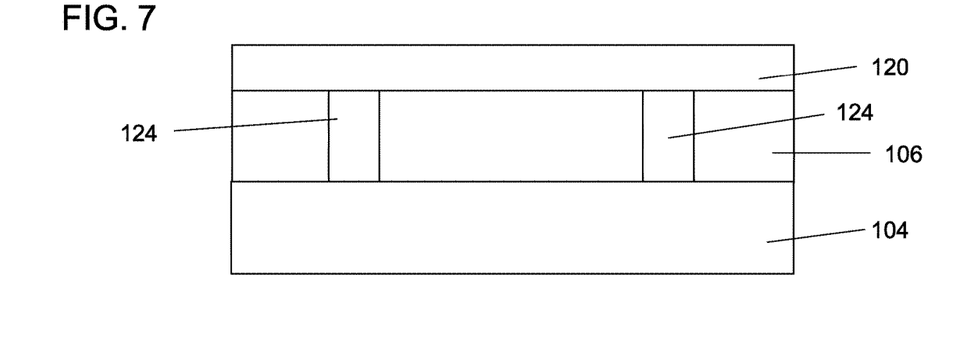
FIG. 7 is a cross-sectional view showing the semiconductor device of FIG. 6 with a thermally conductive dielectric formed over the heat sinks and the dielectric layer in accordance with the present principles.

Referring to FIG. 7, a thermally conductive dielectric material 120 is formed over the dielectric layer 104 and the heat sinks 124. The material 120 provides electrical insulation but also thermal conduction. In one embodiment, the material include DLC. For tetrahedral amorphous carbon (ta-C or DLC), a thermal conductivity approximately of over 10-15 times that $SiO_x$ is provided (e.g., thermal conductivity for DLC: about 3.5 W/mK and thermal conductivity for $SiO_2$ is about 0.2 W/mK for a 10 nm film).

The material 120 is patterned to form openings for metallizations for the fuse/resistor. The fuse/resistor material is deposited and patterned. In one embodiment, the fuse/resistive material include a metal silicide, such as $WSi_x$, although other metal silicides may also be employed. Next, dielectric layer 122 is formed and patterned followed by the formation of metallizations 116 and 114 as depicted in FIG. 3.

Figure 8:
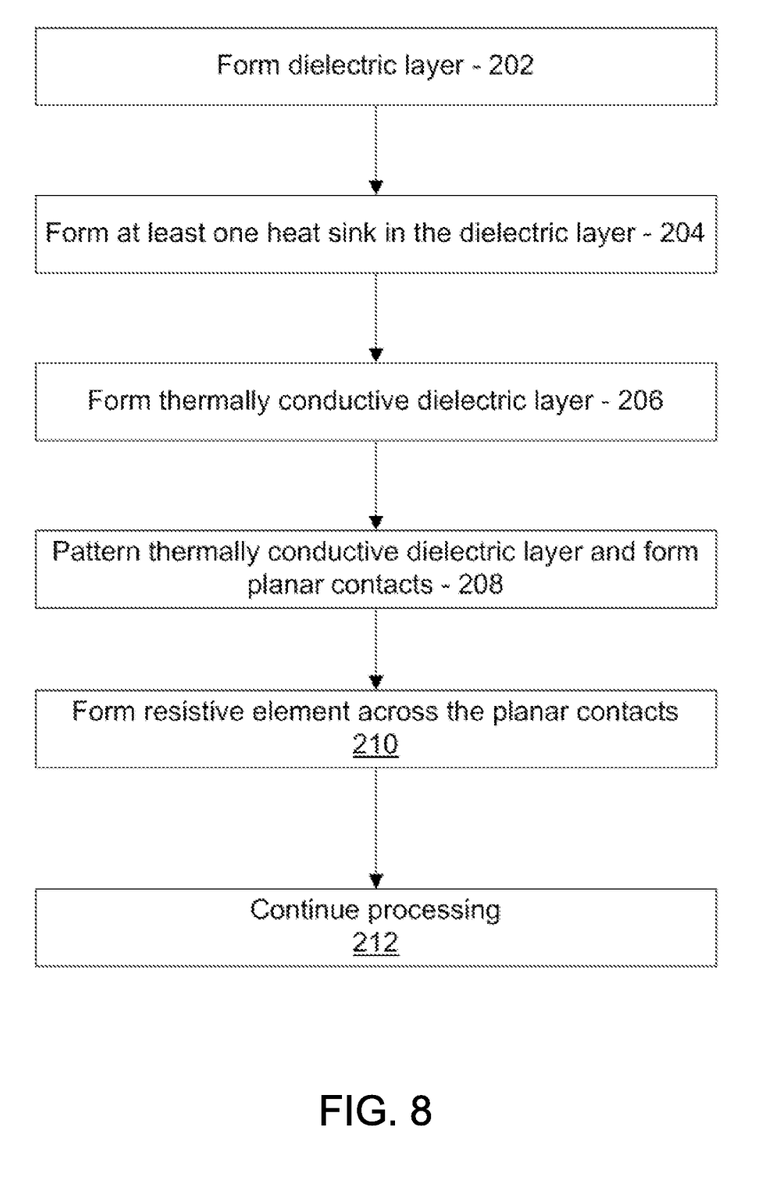
FIG. 8 is a block/flow diagram showing a method for forming a resistive element with heat dissipation features in accordance with one illustrative embodiment.

Referring to FIG. 8, methods for forming a semiconductor device with heat dissipation features is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a first dielectric layer is formed on a substrate. The first dielectric layer may include an oxide or a nitride. The substrate may include a semiconductor-on-insulator substrate, or a bulk semiconductor substrate. The dielectric layer may be formed on an STI region. In block 204, at least one heat sink is formed in the first dielectric layer. The heat sink may be shared across contacts (connect two or more metal structures). The at least one heat sink may include two heat sinks formed on opposite sides of the resistive element, preferably outside a footprint of the resistive element. In one embodiment, the at least one heat sink is formed during a dummy gate structure formation process performed to form dummy gates in other areas of the structure. These dummy gate structures will later be replaced with replacement metal gate (RMG) structures to provide thermally conductive material at or near the planar contacts. While the heat sinks may be in direct contact with the planar contacts, thin dielectric layers may separate the heat sinks from the planar contacts. Even with the thin dielectric layer, thermal energy can be moved away from resistive structures.

In block 206, a thermally conductive dielectric layer is formed on the first dielectric layer. The thermally conductive dielectric layer may include DLC. The thermally conductive dielectric layer may include an entire layer or be patterned in any shape around the resistive elements and contacts. These shapes may include a circular, elliptical, polygonal, etc. or combinations thereof. The shapes can be configured to permit the greatest amount of heat dissipation in accordance with positions around the resistive element.

In block 208, the thermally conductive dielectric layer is patterned to form planar contacts therein. A conductive material is deposited in the thermally conductive dielectric layer and planarized to form the planar contacts. The planar contacts (e.g., horizontally disposed) are spaced apart to form a gap therebetween. The planar contacts may be in contact with or nearly in contact (e.g., a thin dielectric layer disposed between the contacts and eh heat sink) with the at least one heat sink. In one embodiment, the planar contacts may be formed on the thermally conductive dielectric layer or a portion of the thermally conductive dielectric layer.

In block 210, a resistive element (e.g., a resistor or fuse) is formed between the planar contacts over the gap and in contact with at least the thermally conductive dielectric layer in the gap. The resistive element may include a metal silicide material, e.g., WSi. The resistive element may extend over the planar contacts to contact the thermally conductive dielectric layer at end portions (e.g., longitudinal ends) of the resistive element. In block 212, processing continues to complete the device. For example, additional dielectric layers (ILDs), contacts and metallizations are formed.

The resistive element (eFuse) may be employed ion any semiconductor device. eFuses may be employed to enable or disable redundant circuits, to disable failed devices, to protect circuit components, etc. eFuses in accordance with the present principles preserve surrounding structures by controlling heat dissipation to reduce the likelihood that an eFuse will rupture. Instead, failure is provided by other mechanisms, such as electromigration or the like.

Having described preferred embodiments for dielectric thermal conductor for passivating eFuse and metal resistor (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
a first dielectric layer, comprising a thermally conductive dielectric material, formed on a second dielectric layer;
planar contacts formed in the first dielectric layer and on the second dielectric layer, the planar contacts being spaced apart to form a gap therebetween, wherein the thermally conductive dielectric material of the first dielectric layer is formed on lateral sides of the planar contacts and in the gap; and
a resistive element formed laterally across the gap between the planar contacts and in direct contact with at least the thermally conductive dielectric material in the gap.

2. The device as recited in claim 1, further comprising at least one heat sink formed in the second dielectric layer adjacent to the planar contacts.

3. The device as recited in claim 2, wherein the at least one heat sink is formed across the gap in the second dielectric layer.

4. The device as recited in claim 2, wherein the at least one heat sink includes two heat sinks formed on opposite sides of the resistive element outside a footprint of the resistive element.

5. The device as recited in claim 2, wherein the at least one heat sink includes a gate structure.

6. The device as recited in claim 1, wherein the resistive element includes a fuse formed from a metal silicide.

7. The device as recited in claim 1, wherein the thermally conductive dielectric layer includes diamond-like carbon.

8. The device as recited in claim 1, wherein the second dielectric layer is formed on a shallow trench isolation region.

9. The device as recited in claim 1, wherein the resistive element extends over the planar contacts and contacts the thermally conductive dielectric layer at end portions of the resistive element.

10. A semiconductor device, comprising:
a substrate including a shallow trench isolation region formed thereon;
a first dielectric layer formed on the shallow trench isolation region;
a thermally conductive dielectric layer, comprising a thermally conductive dielectric material, formed on the first dielectric layer, the thermally conductive dielectric layer including diamond-like carbon;
planar contacts formed in the thermally conductive dielectric layer, the planar contacts being spaced apart to form a gap therebetween, wherein the thermally conductive dielectric material is formed on lateral sides of the planar contacts and in the gap;
a resistive element formed laterally across the gap between the planar contacts and in direct contact with the thermally conductive dielectric material in the gap; and
heat sinks formed in the first dielectric layer and in contact with the planar contacts on opposite sides of the resistive element outside a footprint of the resistive element.

11. The device as recited in claim 10, wherein the heat sinks are formed across the gap.

12. The device as recited in claim 10, wherein the resistive element includes a fuse formed from a metal silicide.

13. The device as recited in claim 10, wherein the at least one heat sink is formed in a dummy gate structure.

14. The device as recited in claim 10, wherein the resistive element extends over the planar contacts and contacts the thermally conductive dielectric layer at end portions of the resistive element.

15. The device as recited in claim 10, wherein the resistive element extends laterally past the planar contacts and is in direct contact with the thermally conductive dielectric material on lateral sides of the planar contacts.

16. The device as recited in claim 1, wherein the resistive element extends laterally past the planar contacts and is in direct contact with the thermally conductive dielectric material on lateral sides of the planar contacts.

\* \* \* \* \*